(12) United States Patent
Wang

(10) Patent No.: US 12,348,152 B2
(45) Date of Patent: Jul. 1, 2025

(54) SYNCHRONOUS RECTIFIER MODULE

(71) Applicant: Aplus Power Technology (Hangzhou) Co., Ltd., Hangzhou (CN)

(72) Inventor: Yuetian Wang, Hangzhou (CN)

(73) Assignee: Aplus Power Technology (Hangzhou) Co., Ltd., Hangzhou (CN)

( * ) Notice: Subject to any disclaimer, the term of this patent is extended or adjusted under 35 U.S.C. 154(b) by 212 days.

(21) Appl. No.: 18/060,445

(22) Filed: Nov. 30, 2022

(65) Prior Publication Data

US 2023/0170820 A1 Jun. 1, 2023

(30) Foreign Application Priority Data

Nov. 30, 2021 (CN) .......................... 202111447686.5

(51) Int. Cl.
*H02M 7/00* (2006.01)
*H01F 27/28* (2006.01)
*H05K 1/14* (2006.01)

(52) U.S. Cl.
CPC ........ *H02M 7/003* (2013.01); *H01F 27/2847* (2013.01); *H05K 1/145* (2013.01)

(58) Field of Classification Search
CPC ..... H02M 7/003; H01F 27/2847; H05K 1/145
(Continued)

(56) References Cited

U.S. PATENT DOCUMENTS 5,663,635 A 9/1997 Vinciarelli et al.
8,564,394 B2 10/2013 Li et al.
(Continued)

FOREIGN PATENT DOCUMENTS

CN 101296599 A 10/2008
CN 101399490 A 4/2009
(Continued)

OTHER PUBLICATIONS

Mingyang et al., "Method for Realizing DC Output of Wind Turbine Based on Diode Rectifier", High Voltage Engineering, vol. 47, No. 8, Aug. 31, 2021, 13 pages.
(Continued)

*Primary Examiner* — Yemane Mehari
(74) *Attorney, Agent, or Firm* — Hamilton, Brook, Smith & Reynolds, P.C.

(57) ABSTRACT

The embodiments of the present disclosure provide a synchronous rectifier module, comprising: a transformer provided with a plurality of secondary windings, a first circuit board and a second circuit board disposed on opposite sides of the transformer, and a first connecting piece electrically connected to the first circuit board and a second connecting piece electrically connected to the second circuit board; the first connecting piece and the second connecting piece comprise current sharing portions connected to the first circuit board and the second circuit board respectively, and inductor portions which penetrate an inductance core side by side to form an output inductor, resistance values of the current sharing portions of the first connecting piece and the second connecting piece being equal or a resistance difference value therebetween being within a preset range. The present disclosure can quickly, accurately and conveniently improve the efficiency and the heat dissipation of the synchronous rectifier module, and achieve a better current sharing effect of the connecting pieces by adjusting the resistance value numerical range of the two connecting pieces.

14 Claims, 10 Drawing Sheets

(58) Field of Classification Search
USPC .................................................... 363/21.06
See application file for complete search history.

(56) References Cited

U.S. PATENT DOCUMENTS

| | | | |
|---|---|---|---|
| 8,964,410 | B2 | 2/2015 | Chang et al. |
| 10,243,449 | B1 | 3/2019 | Young |
| 10,881,773 | B2 | 1/2021 | Rudser et al. |
| 10,931,206 | B2 | 2/2021 | Yamada |
| 12,200,867 | B2 | 1/2025 | Wang |
| 2005/0083665 | A1 | 4/2005 | Nakashima et al. |
| 2005/0189566 | A1 | 9/2005 | Matsumoto et al. |
| 2006/0034109 | A1 | 2/2006 | Benabdelaziz et al. |
| 2007/0152795 | A1* | 7/2007 | Zeng ............... H01F 27/2804 336/212 |
| 2008/0074204 | A1 | 3/2008 | Ichikawa et al. |
| 2008/0076484 | A1 | 3/2008 | Veselic |
| 2009/0045897 | A1 | 2/2009 | Yang et al. |
| 2009/0309684 | A1* | 12/2009 | Tsai ............... H01F 27/325 336/105 |
| 2010/0033282 | A1 | 2/2010 | Hsu et al. |
| 2010/0045590 | A1 | 2/2010 | Kumamoto et al. |
| 2011/0032683 | A1 | 2/2011 | Li et al. |
| 2012/0099288 | A1 | 4/2012 | Parish |
| 2013/0188329 | A1 | 7/2013 | Chang et al. |
| 2014/0169042 | A1 | 6/2014 | Eguchi |
| 2015/0078042 | A1 | 3/2015 | Standing |
| 2018/0191263 | A1 | 7/2018 | Chida et al. |
| 2018/0197673 | A1 | 7/2018 | Njiende et al. |
| 2018/0205323 | A1* | 7/2018 | Cai ............... H01F 27/29 |
| 2019/0076587 | A1 | 3/2019 | Rudser et al. |
| 2019/0122806 | A1 | 4/2019 | Chou et al. |
| 2019/0140551 | A1 | 5/2019 | Lu et al. |
| 2019/0148061 | A1* | 5/2019 | Lu ............... H05K 1/145 361/784 |
| 2019/0378645 | A1 | 12/2019 | Chiang et al. |
| 2020/0153178 | A1 | 5/2020 | Zhang et al. |
| 2020/0320966 | A1 | 10/2020 | Clark et al. |
| 2021/0134520 | A1 | 5/2021 | Koki |
| 2021/0272737 | A1 | 9/2021 | Jin et al. |
| 2021/0305907 | A1 | 9/2021 | Dong et al. |
| 2021/0315112 | A1 | 10/2021 | Song et al. |
| 2022/0037074 | A1 | 2/2022 | Tashiro |
| 2023/0170819 | A1 | 6/2023 | Wang |
| 2023/0171892 | A1 | 6/2023 | Wang |
| 2024/0038441 | A1 | 2/2024 | Jiang et al. |
| 2024/0055985 | A1 | 2/2024 | Wang |
| 2024/0072646 | A1 | 2/2024 | Wang |

FOREIGN PATENT DOCUMENTS

| | | |
|---|---|---|
| CN | 102881405 A | 1/2013 |
| CN | 103973097 A | 8/2014 |
| CN | 104749426 A | 7/2015 |
| CN | 105099131 A | 11/2015 |
| CN | 105099160 A | 11/2015 |
| CN | 206388585 U | 8/2017 |
| CN | 107147094 A | 9/2017 |
| CN | 107210681 A | 9/2017 |
| CN | 207459970 U | 6/2018 |
| CN | 108667337 A | 10/2018 |
| CN | 209516901 U | 10/2019 |
| CN | 112104201 A | 12/2020 |
| CN | 212659384 U | 3/2021 |
| CN | 212936301 U | 4/2021 |
| CN | 213305278 U | 5/2021 |
| CN | 109787484 B | 6/2021 |
| CN | 214101195 U | 8/2021 |
| CN | 113452271 A | 9/2021 |
| CN | 214154343 U | 9/2021 |
| CN | 214626409 U | 11/2021 |
| EP | 1626493 A1 | 2/2006 |
| JP | 2011-087367 A | 4/2011 |
| WO | 2008/149530 A1 | 12/2008 |

OTHER PUBLICATIONS

Galkin, et al., "Selection of Power Factor Corrector for Modular Uninterruptable Power Supply System," 14th International Power Electronics and Motion Control Conference, EPE-PEMC 2010, 5 pages (2010).

* cited by examiner

SYNCHRONOUS RECTIFIER MODULE

RELATED APPLICATION(S)

This application claims priority under 35 U.S.C. § 119 or 365 to Chinese Application No. 202111447686.5, filed Nov. 30, 2021. The entire teachings of the above application are incorporated herein by reference.

BACKGROUND

With the continuous development of the switching power supply technology, higher requirements are put forward for the power supply design. In which, the efficiency is a key index of the power supply design, and the occurrence of the synchronous rectification technology can effectively solve this problem.

SUMMARY

In the existing rectifier circuit, the Schottky diodes are connected in series in the main output circuit, with a forward voltage drop VF generally of 0.5V and a synchronous rectifier (SR), and can greatly improve the efficiency when being used under the condition of low voltage and large current. In the synchronous rectifier module, when the MOS tube is turned off, the internal body diode bears a reverse voltage, and when the MOS tube is turned on, the conduction loss is mainly determined by an on-resistance Rdson to the switching current flowing through the MOS tube. The on-resistance Rdson can be about 2 mΩ. However, there are differences between the package processes of the synchronous rectifier modules, and the efficiency of each synchronous rectifier module is also different after the package.

Meanwhile, in addition to the efficiency of the synchronous rectifier module, the heat dissipation of the synchronous rectifier module and the current sharing of the connecting pieces are also very important. In the prior art, the connecting pieces are usually designed as an integrated structure, which leads to the problem of current non-sharing.

Therefore, by virtue of years of experience and practice in related industries, the inventor proposes a synchronous rectifier module to overcome the defects in the prior art.

Aiming at the problems in the prior art, the present disclosure provides a synchronous rectifier module, which can quickly, accurately and conveniently improve the efficiency and the heat dissipation of the synchronous rectifier module, and achieve a better current sharing effect of the connecting pieces.

In order to solve at least one of the above technical problems, the present disclosure provides the following technical solutions:

In a first aspect, the present disclosure provides a synchronous rectifier module, comprising: a transformer provided with a plurality of secondary windings, a first circuit board and a second circuit board disposed on opposite sides of the transformer, and a first connecting piece electrically connected to the first circuit board and a second connecting piece electrically connected to the second circuit board;

the first connecting piece and the second connecting piece comprise current sharing portions connected to the first circuit board and the second circuit board respectively, and inductor portions which penetrate an inductance core side by side to form an output inductor, and resistance values of the current sharing portions of the first connecting piece and the second connecting piece being equal or a resistance difference value therebetween being within a preset range.

Further, the resistance difference value between the current sharing portions of the first connecting piece and the second connecting piece is within a preset resistance difference value numerical range.

Further, ratios of the resistance difference value between the current sharing portions of the first connecting piece and the second connecting piece to the resistance values of the current sharing portions of the first connecting piece and the second connecting piece are within a preset resistance difference value ratio range, respectively.

Further, the first circuit board and the second circuit board are provided with a plurality of electronic devices, which are electrically connected to pins of the secondary windings of the transformer through plug holes opened in the first circuit board and the second circuit board.

Further, the current sharing portion is electrically connected to the first circuit board and the second circuit board through plug holes.

Further, the current sharing portion is perpendicularly connected to the inductor portion.

Further, the first connecting piece and the second connecting piece are made of metallic copper.

Further, the current sharing portions of the first connecting piece and the second connecting piece are disposed side by side in parallel.

Further, the inductor portions of the first connecting piece and the second connecting piece are disposed side by side in parallel, and perpendicular connection parts thereof with the current sharing portions being provided with radians.

Further, the first circuit board and the second circuit board are disposed perpendicular to a main board in the transformer.

Further, a voltage of the secondary winding of the transformer is less than 20 V.

Further, the secondary winding of the transformer has a copper sheet structure.

Further, the transformer further comprises a primary winding which is provided with an insulation layer.

Further, the primary windings and the secondary windings of the transformer are disposed as being interleaved.

As can be seen from the above technical solutions, the present disclosure provides a synchronous rectifier module, where a first circuit board and a second circuit board are respectively connected to a first connecting piece and a second connecting piece, so that the two connecting pieces achieve a better current sharing effect, thus quickly, accurately and conveniently improving the efficiency and the heat dissipation of the synchronous rectifier module, and achieving a better current sharing effect of the connecting pieces.

BRIEF DESCRIPTION OF THE DRAWINGS

In order to more clearly explain the technical solutions in embodiments of the present disclosure or in the prior art, the drawings required for describing the embodiments or the prior art will be briefly introduced below. Obviously, the drawings in the following description just illustrate some embodiments of the present disclosure, and those of ordinary skills in the art can obtain other drawings from them without paying any creative effort.

REFERENCE NUMERALS

Figure 1:
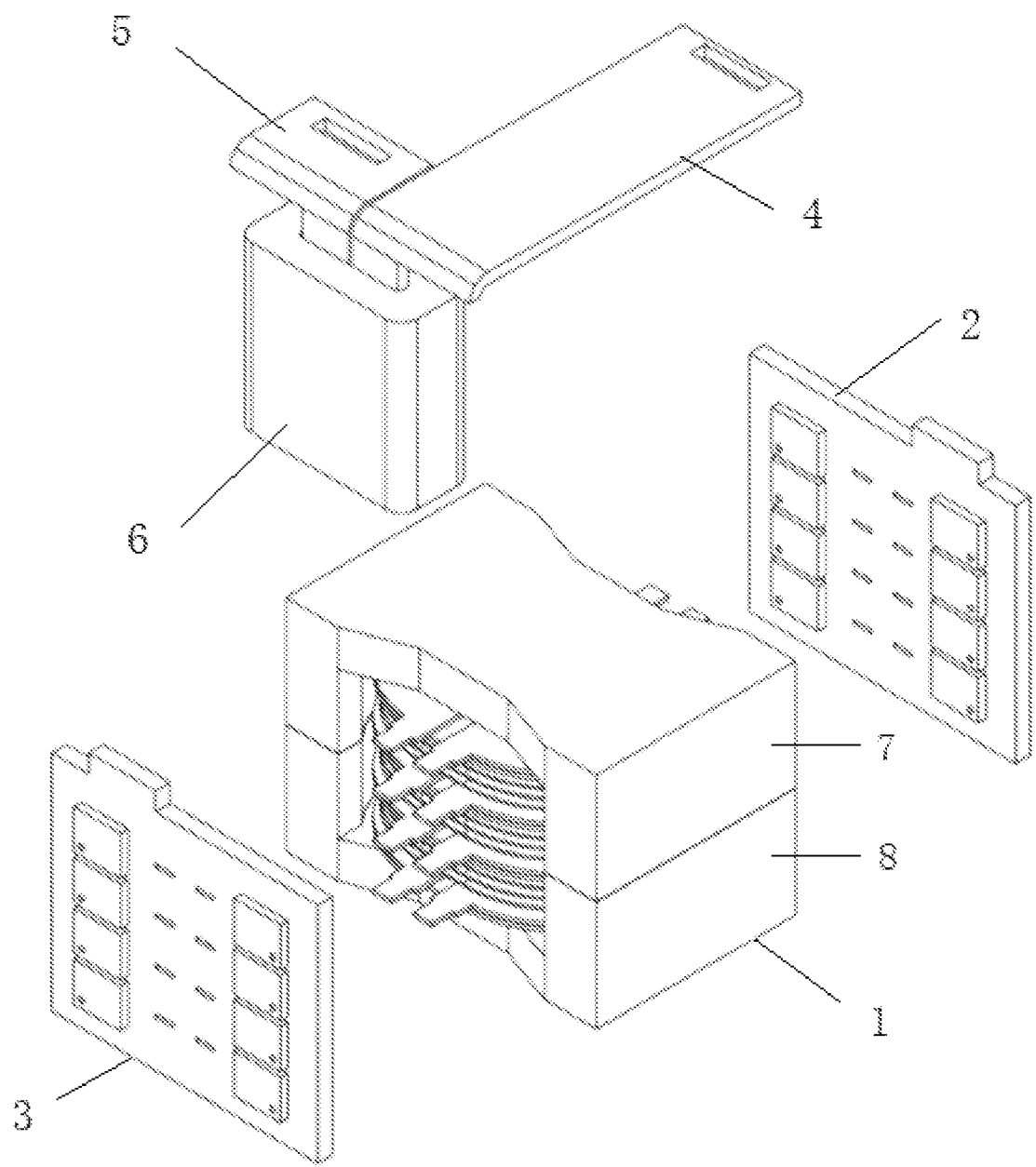
FIG. 1 is a schematic diagram of an explosion structure of a synchronous rectifier module according to the present disclosure.

1: transformer
2: first circuit board
3: second circuit board
4: first connecting piece
41: current sharing portion
42: inductor portion
5: second connecting piece
6: inductance core
7: first magnetic core
8: second magnetic core The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

For better understanding of the solutions of the present disclosure by persons skilled in the art, the technical solutions in the embodiments of the present disclosure will be described clearly and completely below with reference to the drawings thereof. Obviously, those described are only a part, rather than all, of the embodiments of the present disclosure. Based on the embodiments of the present disclosure, any other embodiment obtained by those of ordinary skills in the art without paying any creative labor should fall within the protection scope of the present disclosure.

It should be noted that in the Description, claims and the above drawings of the present disclosure, the terms such as 'first' and 'second' are used to distinguish similar objects, and are not necessarily used to describe a specific sequence or precedence order. It should be understood that data used in this way can be interchanged under appropriate circumstances, for the convenience of describing the embodiments of the present disclosure. In addition, the terms 'comprise/include' and 'have' and any variation thereof are intended to cover non-exclusive inclusion. For example, any process, method, system, product or device that includes a series of steps or units is not necessarily limited to those steps or units that are clearly listed, but may include other steps or units that are not clearly listed or inherent to such process, method, product or device.

In the present disclosure, the orientations or positional relationships indicated by the terms 'on', 'under', 'left', 'right', 'front', 'rear', 'top', 'bottom', 'inner', 'outer', 'middle', 'vertical', 'horizontal', 'lateral', 'longitudinal' and the like are based on those illustrated in the drawings. These terms are mainly used to better describe the present disclosure and the embodiments thereof, rather than limiting that the indicated devices, elements or components must have specific orientations, or be constructed and operated in specific orientations.

Moreover, some of the above terms may be used to indicate other meanings in addition to the orientations or positional relationships. For example, the term 'on' may also be used to indicate a certain attachment relationship or connection relationship in some cases. Those of ordinary skills in the art can understand the specific meanings of these terms in the present disclosure depending on the specific situations.

Further, the terms 'mount', 'set', 'provided with', 'couple', 'connect' and 'socket' should be construed broadly. For example, there may be a fixed connection, a detachable connection, or a one-piece construction; there may be a mechanical connection or an electrical connection; there may be a direct connection, or an indirect connection through an intermediate medium; or there may be an internal communication between two devices, elements, or components. For those of ordinary skills in the art, the specific meanings of the above terms in the present disclosure can be understood depending on specific situations.

It should be noted that the embodiments in the present disclosure and the features in the embodiments can be combined with each other if there is no conflict. The present disclosure will be described in detail below with reference to the drawings and embodiments.

Figure 3:
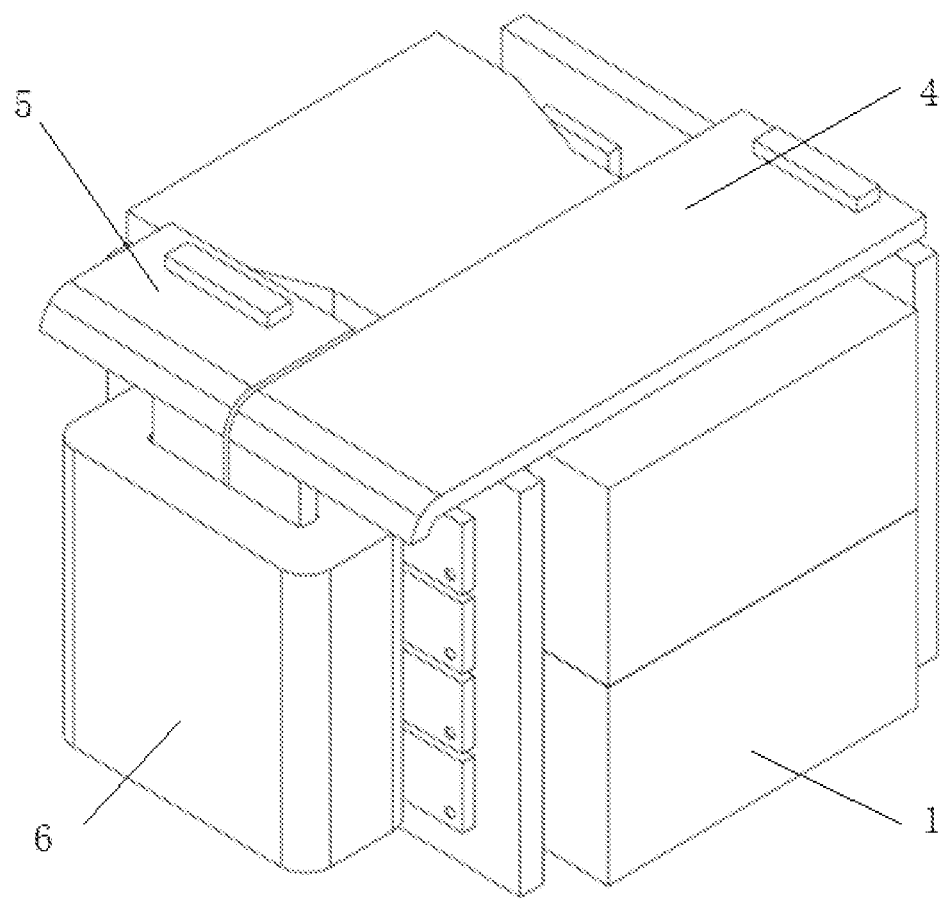
FIG. 3 is a schematic diagram of a combined structure of a synchronous rectifier module according to the present disclosure.

Considering that in the prior art, the connecting pieces are usually designed as an integrated structure, which leads to the problem caused by current non-sharing. In order to quickly, accurately and conveniently improve the efficiency and the heat dissipation of the synchronous rectifier module and achieve a better current sharing effect of the connecting pieces, the present disclosure provides an embodiment of a synchronous rectifier module. As illustrated in FIGS. 1 and 3, in this embodiment, the synchronous rectifier module specifically comprises: a transformer 1 provided with a plurality of secondary windings, a first circuit board 2 and a second circuit board 3 disposed on opposite sides of the transformer 1, and a first connecting piece 4 electrically connected to the first circuit board 2 and a second connecting piece 5 electrically connected to the second circuit board 3.

Figure 2:
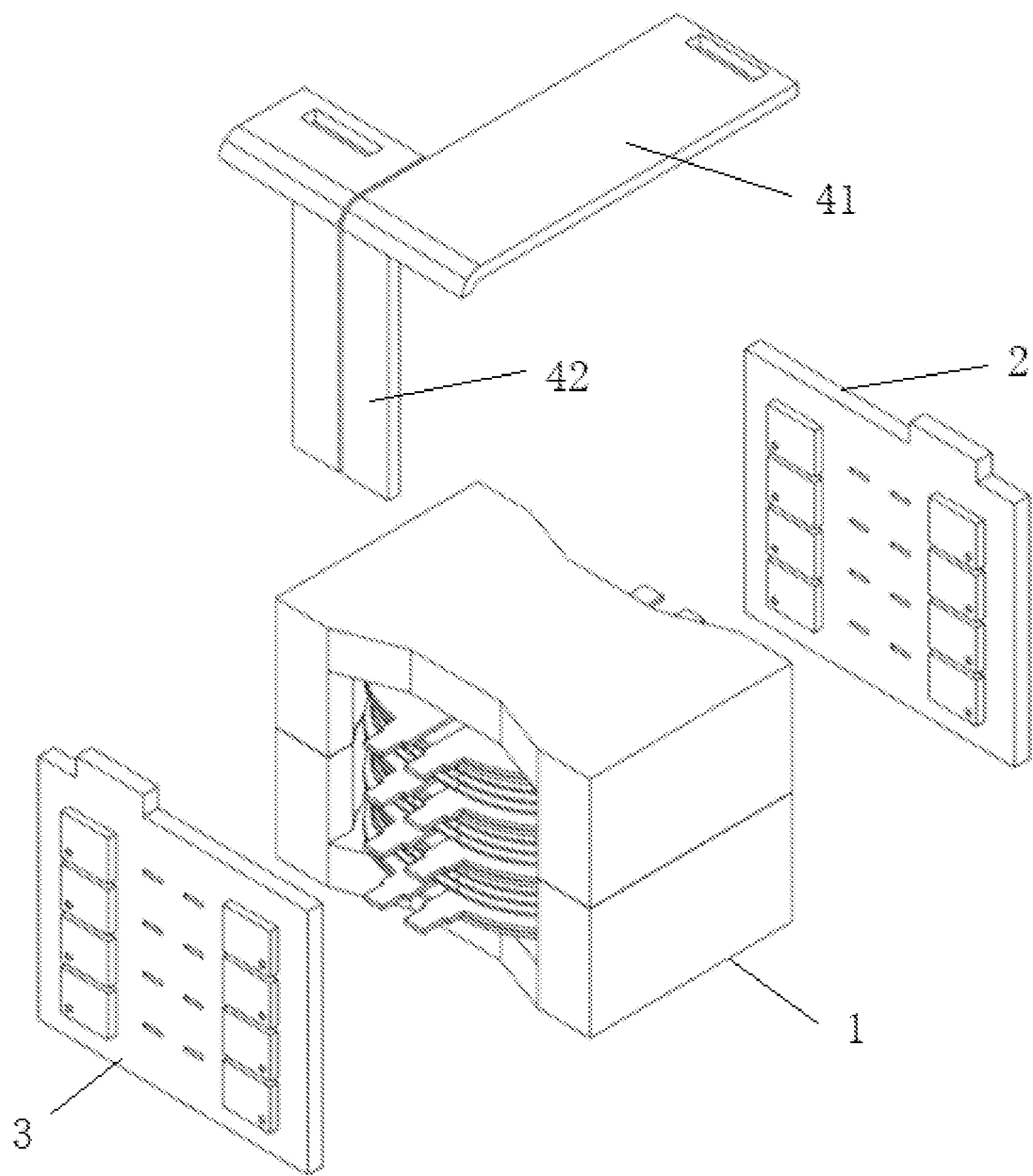
FIG. 2 is a schematic diagram of a structure of a current sharing portion and an inductor portion according to the present disclosure.

Referring to FIG. 2, the first connecting piece 4 and the second connecting piece 5 each includes a current sharing portion 41 and an inductor portion 42 integrally connected thereto, where the current sharing portions 41 are respectively connected to the first circuit board 2 and the second circuit board 3, and the inductor portions 42 penetrate an inductance core 6 side by side to form an output inductor. Resistance values of the current sharing portions of the first connecting piece 4 and the second connecting piece 5 are equal or a resistance difference value therebetween is within a preset range.

Figure 4:
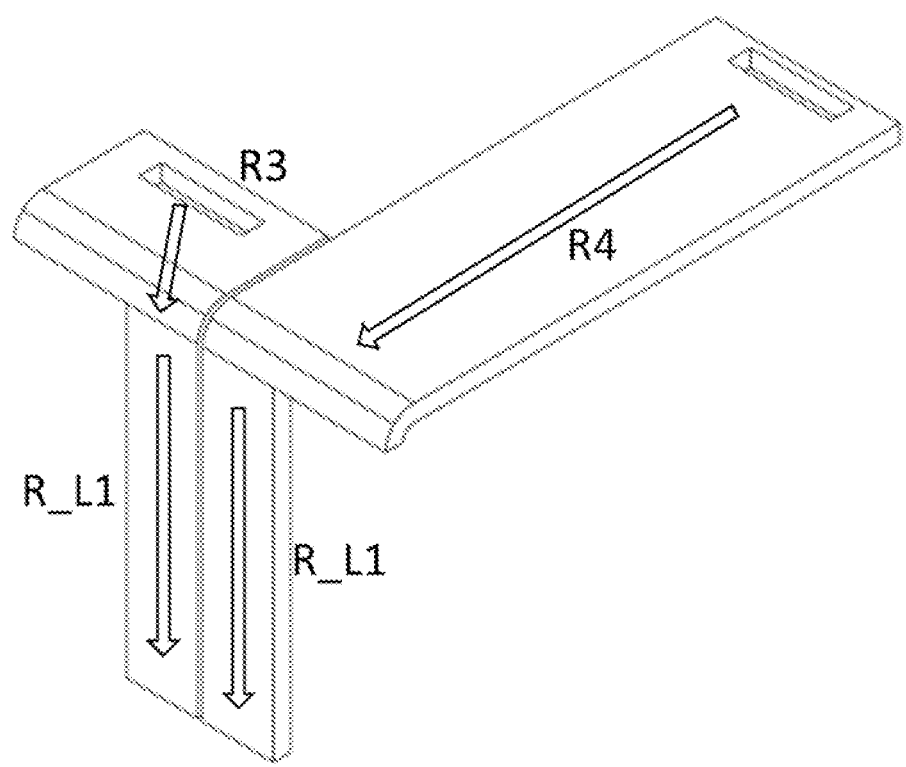
FIG. 4 is a resistance distribution diagram of a current sharing portion and an inductor portion according to the present disclosure.
Figure 5:
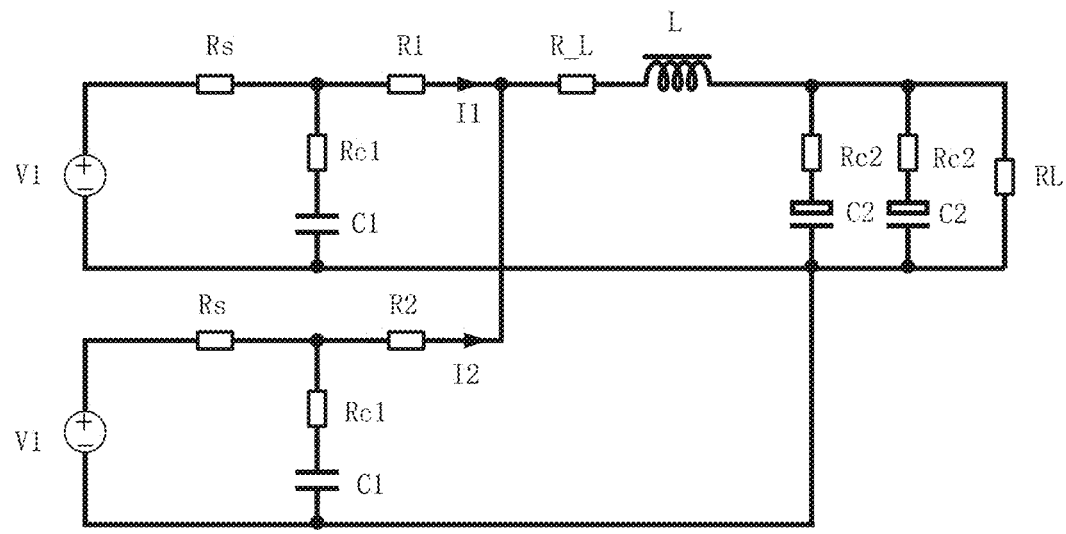
FIG. 5 is an equivalent circuit diagram of an output inductor of a synchronous rectifier module in the prior art.
Figure 6:
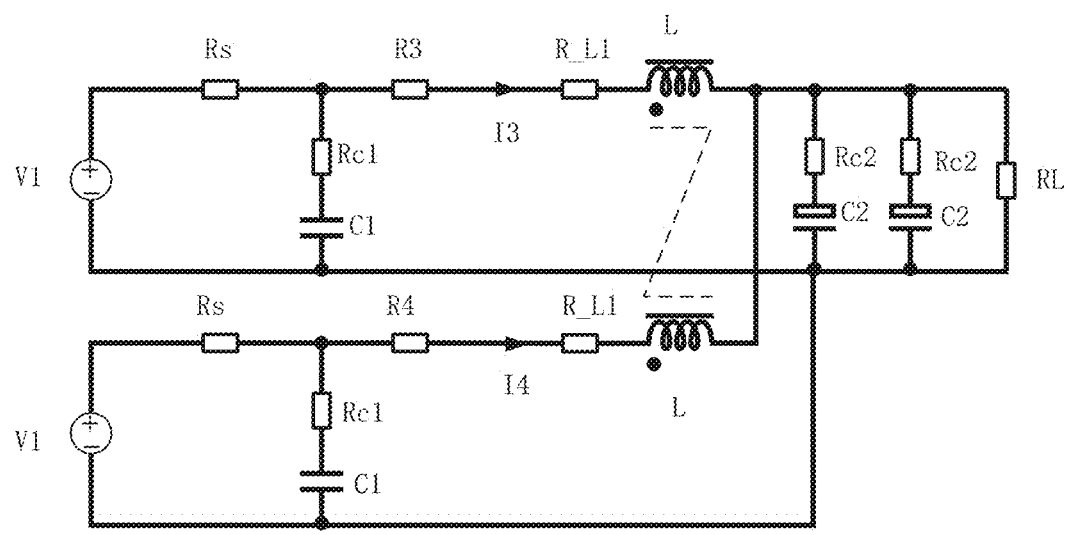
FIG. 6 is an equivalent circuit diagram of an output inductor of a synchronous rectifier module according to the present disclosure.

Referring to the equivalent circuit diagram of the prior art in FIG. 5, the equivalent circuit diagram of the present disclosure in FIG. 6, and the resistance distribution diagram of the current sharing portion and the inductor portion in FIG. 4, where V1 is a secondary voltage of the transformer, Rs is a resistance value of the secondary winding, R1 in FIG. 5 (or R3 in FIG. 6) is a resistance value from a position connected to the first circuit board 2 to one end of the output inductor, R2 in FIG. 5 (or R4 in FIG. 6) is a resistance value from a position connected to the second circuit board 3 to one end of the output inductor, R_L1 is a resistance value from one end of the output inductor to the other end through a core of the output inductor, and current flowing through the secondary sides correspondingly connected to the two circuit boards is I1 and I2, respectively, then:

$$\frac{I_1}{I_2} = \frac{R_s + R_2}{R_s + R_1}$$

It can be understood that since R1 and R2 are determined by the geometries of the connecting pieces, there is usually a large difference therebetween, and then I1 and I2 will not be shared, which further causes the uneven heating of the synchronous rectification plates on both sides.

In the technical solution of the present disclosure, the connecting piece is divided into two parts, i.e., $$\frac{I_1}{I_2} = \frac{R_s + R_4 + R_{L1}}{R_s + R_3 + R_{L2}}$$

Therefore, in the present disclosure, by artificially adjusting a ratio of R3 to R4, the resistance values (R3 and R4) of the current sharing portions 41 of the first connecting piece 4 and the second connecting piece 5 are equal, or the resistance difference value (R3–R4 or R4–R3) therebetween is within a preset range, so that the current I1=I2 or I1≈I2, thus the two connecting pieces of the present disclosure can achieve a better current sharing effect.

In some embodiments, the resistance difference value of the present disclosure being within the preset range may mean that a difference between the resistance values (i.e., R3–R4 or an absolute value thereof, or R4–R3 or an absolute value thereof) of the current sharing portions 41 of the first connecting piece 4 and the second connecting piece 5 is within a preset resistance difference value numerical range, such as within 20Ω, or within 10Ω, or within 5Ω, or within 3Ω, or within 2Ω, or within 1Ω, or within 0.5Ω.

In other embodiments, in the preset range, the resistance difference value of the present disclosure being within the preset range may mean that ratios of a resistance value difference (i.e., R3–R4 or an absolute value thereof, or R4–R3 or an absolute value thereof) between the current sharing portions 41 of the first connecting piece 4 and the second connecting piece 5 to the resistance values of the current sharing portions 41 of the first connecting piece 4 and the second connecting piece 5, e.g., (R3–R4)/R3, (R3–R4)/R4, (R4–R3)/R3 and (R4–R3)/R4, are respectively within a preset resistance difference value ratio range, such as within 20%, or within 10%, or within 5%, or within 3%, or within 2%, *or within 1%, or within 0.5%.

It can be understood that in the present disclosure, the specific value of the resistance difference value numerical range and the specific value of the preset resistance difference value ratio range may not be specifically limited, provided that a better current sharing effect can be achieved by adjusting the resistance values of the two connecting pieces as equal or similar as possible. Persons skilled in the art can change and replace the specific values depending on the specific application scenarios, without departing from the patent protection scope of the present disclosure.

As can be seen from the above description, in the synchronous rectifier module according to the embodiment of the present disclosure, the first connecting piece 4 and the second connecting piece 5 are respectively connected by the first circuit board 2 and the second circuit board 3, so that the two connecting pieces can achieve a better current sharing effect, thus quickly, accurately and conveniently improving the efficiency and the heat dissipation of the synchronous rectifier module, and achieving a better current sharing effect of the connecting pieces.

As a feasible implementation, the first circuit board 2 and the second circuit board 3 of the present disclosure are provided with a plurality of electronic devices, which are electrically connected to pins of the secondary windings of the transformer 1 through plug holes opened in the first circuit board 2 and the second circuit board 3, which saves the energy consumption for electrical connection through electric lines and wires in the prior art, and improves the overall working efficiency of different rectifier modules, Moreover, the relative arrangement of the first circuit board 2 and the second circuit board 3 can also achieve a better heat dissipation effect.

It can be understood that the plug hole can be square or circular, or with a special shape so long as the circuit board and the pins can be tightly connected. The shape of the plug hole is not specifically limited here.

As a feasible implementation, the first connecting piece 4 and the second connecting piece 5 each includes a current sharing portion 41 electrically connected to the first circuit board 2 and the second circuit board 3 through plug holes, respectively, and an inductor portion 42 disposed perpendicular to the current sharing portion 41. The inductor portions 42 of the first connecting piece 4 and the second connecting piece 5 may penetrate an inductance core 6 side by side to form an output inductor.

Optionally, the first connecting piece 4 and the second connecting piece 5 may be respectively provided with plug holes for electrical connection with the circuit board. Specifically, the first connecting piece 4 and the second connecting piece 5 each may be composed of two parts, i.e., a current sharing portion 41 provided with a plug hole and an inductor portion 42 disposed perpendicular to the current sharing portion 41. Since the first connecting piece 4 and the second connecting piece 5 are made of a conductive material (preferably metallic copper), the direct current can flow therethrough.

As a feasible implementation, the first connecting piece 4 and the second connecting piece 5 may be made of metallic copper or any other conductive material.

As a feasible implementation, the current sharing portions 41 of the first connecting piece 4 and the second connecting piece 5 are disposed side by side in parallel; the inductor portions 42 of the first connecting piece 4 and the second connecting piece 5 are provided side by side in parallel, and perpendicular connection parts thereof with the current sharing portions 41 may be provided with radians, which can reduce the energy loss and improve the working efficiency of the synchronous rectifier.

As a feasible implementation, the first circuit board 2 and the second circuit board 3 may be disposed perpendicular to a main board in the transformer 1.

As a feasible implementation, the voltage of the secondary winding of the transformer 1 is less than 20 V, i.e., the secondary winding of the transformer 1 is preferentially of a low-voltage output. Alternatively, the secondary winding of the transformer 1 has a copper sheet structure. In addition, the transformer 1 may further include a primary winding which is provided with an insulation layer, and the primary winding and the secondary winding of the transformer 1 are disposed as being interleaved (an interleave structure).

Figure 7:
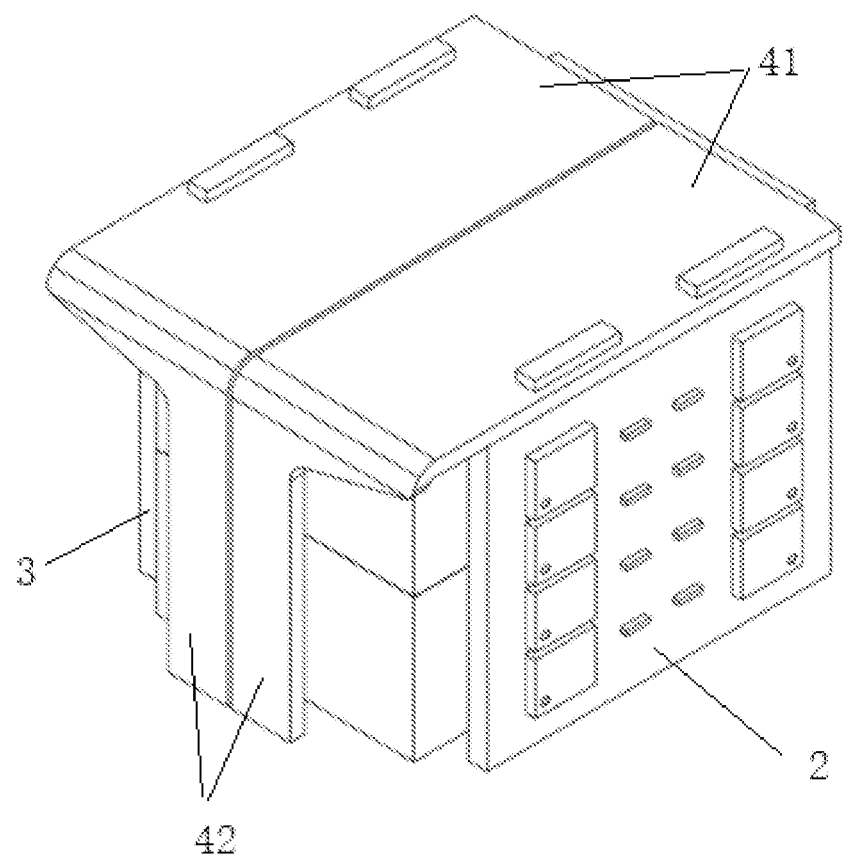
FIG. 7 is a first schematic diagram of a position change of a connecting piece according to an embodiment of the present disclosure.
Figure 8:
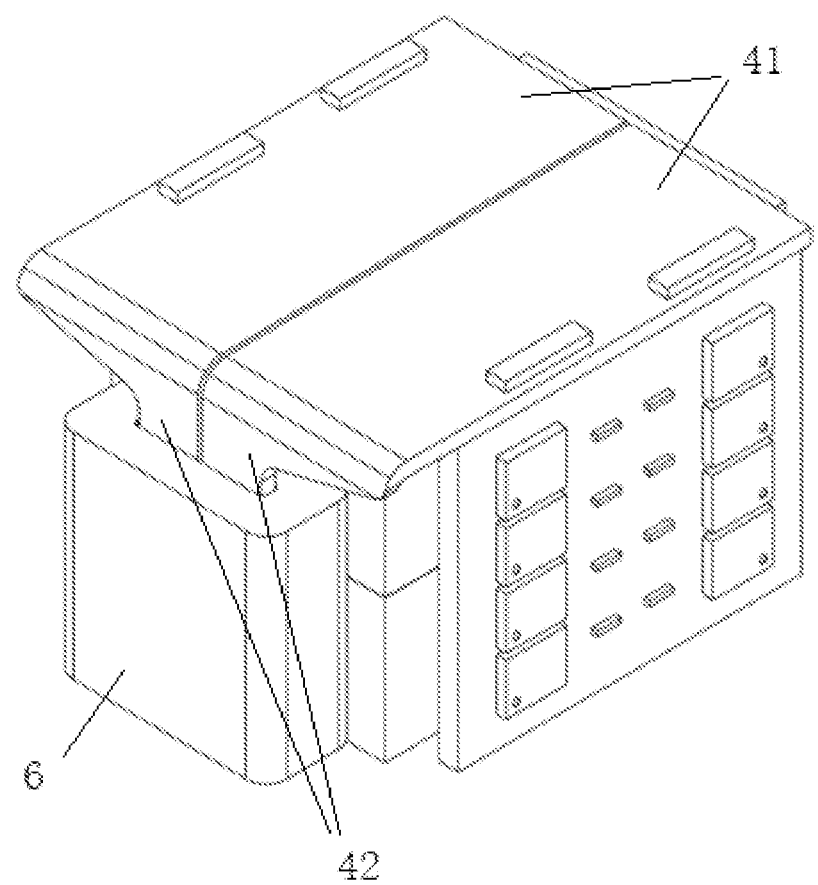
FIG. 8 is a second schematic diagram of a position change of a connecting piece according to an embodiment of the present disclosure.

Referring to FIGS. 7 and 8, in another feasible implementation of the present disclosure, the current sharing portions 41 are disposed at the upper end of the transformer 1, while the inductor portions 42 may be disposed side by side on the same side of the transformer 1, such as the same side as the circuit board or a different side from the circuit board.

Figure 9:
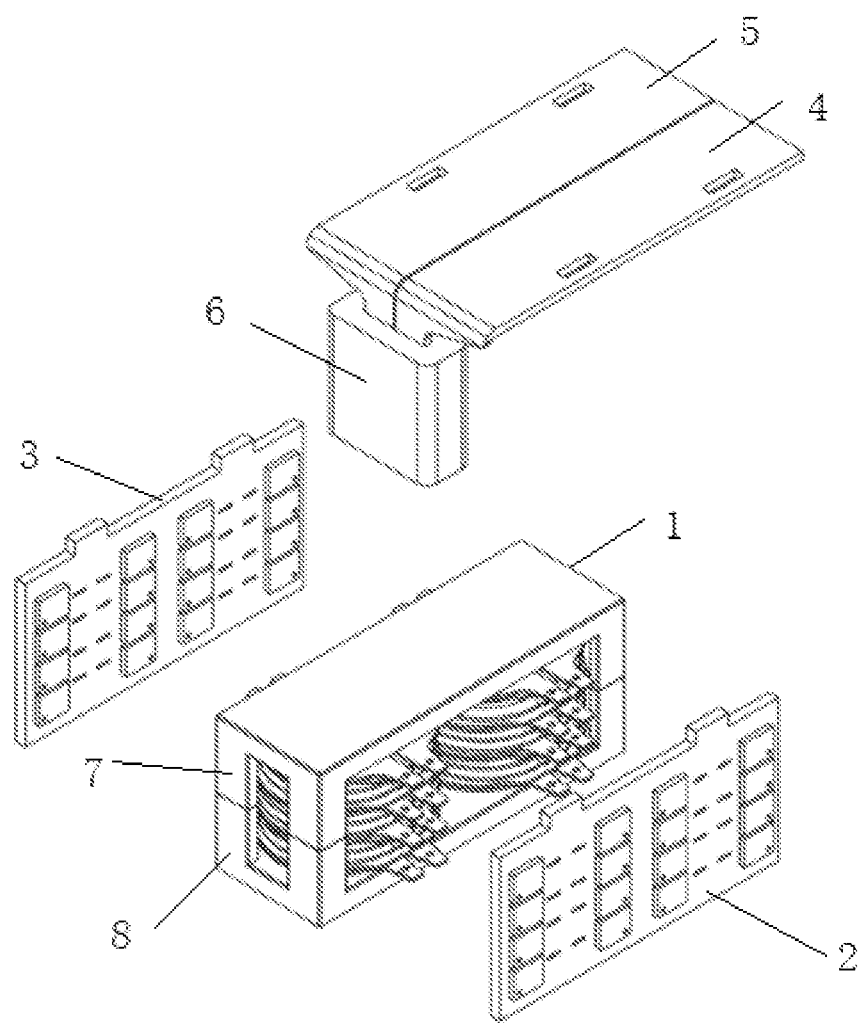
FIG. 9 is a schematic diagram of an explosion structure of a synchronous rectifier module integrated with multiple transformers according to another embodiment of the present disclosure.

Referring to FIG. 9, as a feasible implementation, the transformer 1 includes a first magnetic core 7 and a second magnetic core 8, which are connected in a vertical direction.

Figure 10:
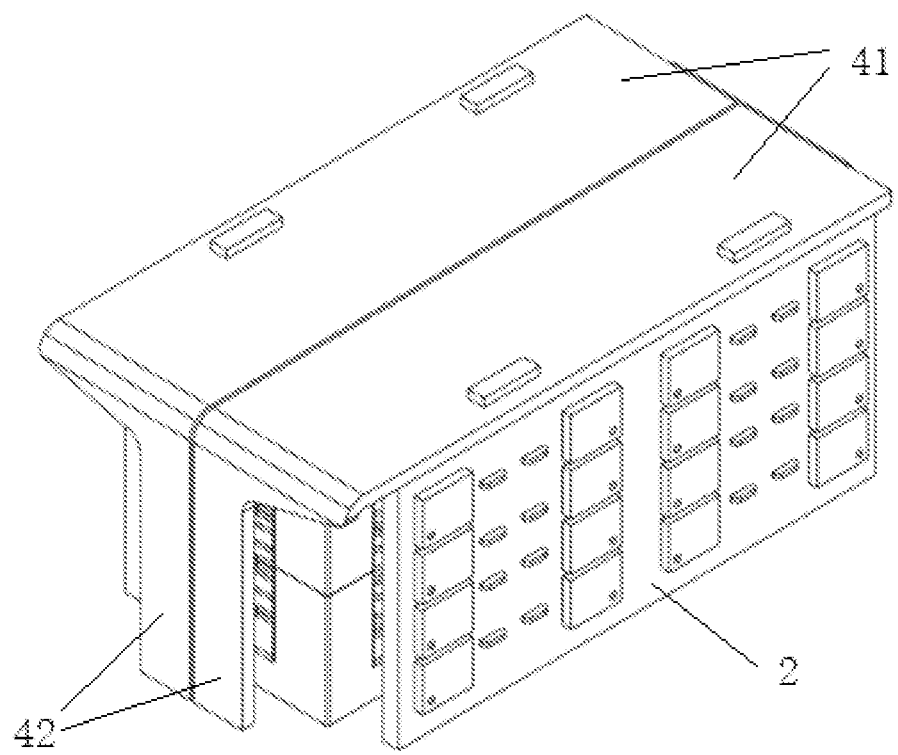
FIG. 10 is a first schematic diagram of a combined structure of a synchronous rectifier module integrated with multiple transformers according to another embodiment of the present disclosure.
Figure 11:
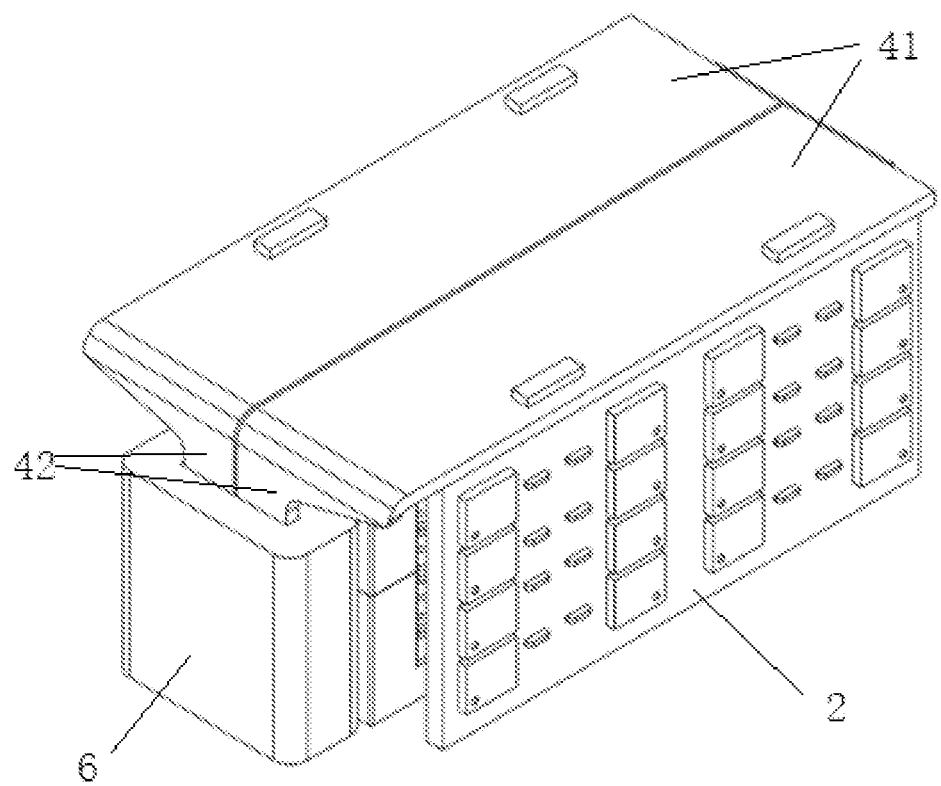
FIG. 11 is a second schematic diagram of a combined structure of a synchronous rectifier module integrated with multiple transformers according to another embodiment of the present disclosure.

Referring to FIGS. 9, 10 and FIG. 11, in another feasible implementation of the present disclosure, a plurality of (e.g., two) integrated transformers may be disposed between the first magnetic core 7 and the second magnetic core 8, and correspondingly, new plug holes may be added to the first circuit board 2 and the second circuit board 3 for connection.

The teachings of all patents, published applications and references cited herein are incorporated by reference in their entirety.

Those described are only schematic embodiments of the present disclosure, rather than limiting the scope of the present disclosure. Any equivalent change or modification made by persons skilled in the art without departing from the concept and principle of the present disclosure should fall within the protection scope of the present disclosure.

What is claimed is:

1. A synchronous rectifier module, comprising: a transformer provided with a plurality of secondary windings, a first circuit board and a second circuit board disposed on opposite sides of the transformer, and a first connecting piece electrically connected to the first circuit board and a second connecting piece electrically connected to the second circuit board;

the first connecting piece and the second connecting piece comprise current sharing portions connected to the first circuit board and the second circuit board respectively, and inductor portions which penetrate an inductance core side by side to form an output inductor, and resistance values of the current sharing portions of the first connecting piece and the second connecting piece being equal or a resistance difference value therebetween being within a preset range;

wherein, current flowing through the secondary sides correspondingly connected to the two circuit boards is $I_1$ and $I_2$:

$$\frac{I_1}{I_2} = \frac{R_s + R_4 + R_{L1}}{R_s + R_3 + R_{L1}}$$

wherein, $R_s$ is a resistance value of the secondary winding; $R_{L1}$ is a resistance value from one end of the output inductor to the other end through a core of the output inductor, and $R_3$ is the resistance value from the position connected to the first circuit board to one end of the output inductor; $R_4$ is the resistance value from the position connected to the second circuit board to one end of the output inductor;

by adjusting a ratio of $R_3$ to $R_4$, the resistance values of the current sharing portions of the first connecting piece and the second connecting piece are equal, or the resistance difference value therebetween is within a preset range, so that the current $I_1=I_2$ or $I_1 \approx I_2$, thus the two connecting pieces achieve a better current sharing effect.

2. The synchronous rectifier module according to claim 1, wherein the resistance difference value between the current sharing portions of the first connecting piece and the second connecting piece is within a preset resistance difference value numerical range.

3. The synchronous rectifier module according to claim 1, wherein ratios of the resistance difference value between the current sharing portions of the first connecting piece and the second connecting piece to the resistance values of the current sharing portions of the first connecting piece and the second connecting piece are within a preset resistance difference value ratio range, respectively.

4. The synchronous rectifier module according to claim 1, wherein the first circuit board and the second circuit board are provided with a plurality of electronic devices, which are electrically connected to pins of the secondary windings of the transformer through plug holes opened in the first circuit board and the second circuit board.

5. The synchronous rectifier module according to claim 1, wherein the current sharing portion is electrically connected to the first circuit board and the second circuit board through plug holes.

6. The synchronous rectifier module according to claim 1, wherein the current sharing portion is perpendicularly connected to the inductor portion.

7. The synchronous rectifier module according to claim 1, wherein the first connecting piece and the second connecting piece are made of metallic copper.

8. The synchronous rectifier module according to claim 1, wherein the current sharing portions of the first connecting piece and the second connecting piece are disposed side by side in parallel.

9. The synchronous rectifier module according to claim 1, wherein the inductor portions of the first connecting piece and the second connecting piece are disposed side by side in parallel, and perpendicular connection parts thereof with the current sharing portions being provided with radians.

10. The synchronous rectifier module according to claim 1, wherein the first circuit board and the second circuit board are disposed perpendicular to a main board in the transformer.

11. The synchronous rectifier module according to claim 1, wherein a voltage of the secondary winding of the transformer is less than 20 V.

12. The synchronous rectifier module according to claim 1, wherein the secondary winding of the transformer has a copper sheet structure.

13. The synchronous rectifier module according to claim 1, wherein the transformer further comprises a primary winding which is provided with an insulation layer.

14. The synchronous rectifier module according to claim 13, wherein the primary windings and the secondary windings of the transformer are disposed as being interleaved.

\* \* \* \* \*